United States Patent
Kim

(10) Patent No.: US 12,239,026 B2
(45) Date of Patent: Feb. 25, 2025

(54) EMBEDDED DEVICE INCLUDING MRAM DEVICE

(71) Applicant: SAMSUNG ELECTRONICS CO., LTD., Suwon-si (KR)

(72) Inventor: Jaehoon Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 17/748,127

(22) Filed: May 19, 2022

(65) Prior Publication Data

US 2023/0081312 A1 Mar. 16, 2023

(30) Foreign Application Priority Data

Sep. 13, 2021 (KR) .......... 10-2021-0121554

(51) Int. Cl.
*H10N 50/80* (2023.01)
*H10B 61/00* (2023.01)
*H10N 50/01* (2023.01)

(52) U.S. Cl.
CPC .......... *H10N 50/80* (2023.02); *H10B 61/00* (2023.02); *H10N 50/01* (2023.02)

(58) Field of Classification Search
CPC ......... H10N 50/80; H10N 50/01; H10B 61/00
USPC ....................................................... 257/422
See application file for complete search history.

(56) References Cited

U.S. PATENT DOCUMENTS

| | | | |
|---|---|---|---|
| 7,869,165 B2 | 1/2011 | Miyauchi et al. | |
| 8,749,919 B2 | 6/2014 | Sasaki et al. | |
| 8,922,951 B2 | 12/2014 | Sapozhnikov et al. | |
| 9,024,399 B2 | 5/2015 | Guo | |
| 9,252,108 B2 | 2/2016 | Fujimori | |
| 9,553,052 B2 | 1/2017 | Matsubara et al. | |
| 9,875,971 B2 | 1/2018 | Bhushan et al. | |
| 2012/0187079 A1* | 7/2012 | Mashima | G01R 33/098 216/22 |
| 2014/0225208 A1* | 8/2014 | Gu | H10B 61/22 257/422 |
| 2016/0351792 A1* | 12/2016 | Jiang | H10B 61/20 |
| 2019/0386061 A1* | 12/2019 | Liu | H10N 50/10 |

FOREIGN PATENT DOCUMENTS

KR    10-2293010 B1    8/2021

* cited by examiner

*Primary Examiner* — Jami Valentine Miller
(74) *Attorney, Agent, or Firm* — Muir Patent Law, PLLC

(57) ABSTRACT

An embedded device includes a substrate including a magnetic random access memory (MRAM) region, the MRAM region having a cell block region, magnetic tunnel junction (MTJ) modules in the cell block region, each of the MTJ modules including a MTJ pattern, an insulating interlayer structure covering the MTJ modules, and magnetic field shielding structures in the insulating interlayer structure and adjacent to an outside of the cell block region, each of the magnetic field shielding structures extending in a vertical direction to face at least from an upper end of the MTJ pattern to a lower end of the MTJ pattern, and each of the magnetic field shielding structures including a ferromagnetic material.

20 Claims, 23 Drawing Sheets

EMBEDDED DEVICE INCLUDING MRAM DEVICE

CROSS-REFERENCE TO RELATED APPLICATION

This application claims priority under 35 USC § 119 to Korean Patent Application No. 10-2021-012554, filed on Sep. 13, 2021, in the Korean Intellectual Property Office (KIPO), the contents of which are incorporated by reference herein in their entirety.

BACKGROUND

1. Field

Example embodiments relate to an embedded device including a magnetic random access memory (MRAM) device. More particularly, example embodiments relate to an embedded device including MRAM modules in which external magnetic fields are shielded.

2. Description of the Related Art

A vertical Spin-Transfer Torque (STT) Magnetic Random Access Memory (MRAM) may be a nonvolatile memory that stores data by magnetoresistance. The vertical STT-MRAM may include a pinned layer, in which a magnetization direction is fixed, and a free layer, in which a magnetization direction is changed. The magnetization direction of the vertical STT-MRAM may be a direction perpendicular to a surface of a substrate. The magnetization direction of the free layer may be aligned in the same direction or opposite direction to the magnetization direction of the pinned layer.

SUMMARY

According to example embodiments, there is provided an embedded device. The embedded device may include a substrate, magnetic tunnel junction (MTJ) modules, an insulating interlayer structure, and magnetic field shielding structures. The substrate may include a magnetic random access memory (MRAM) region. The substrate may include a cell block region within the MRAM region. The MTJ modules may be formed in the cell block region. Each of the MTJ modules may include a MTJ pattern. The insulating interlayer structure may cover the MTJ modules. The magnetic field shielding structures may be disposed adjacent to an outside of the cell block region. The magnetic field shielding structures may be formed in the insulating interlayer structure. Each of the magnetic field shielding structures may extend in a vertical direction to face at least from an upper end of the MTJ pattern to a lower end of the MTJ pattern. Each of the magnetic field shielding structures may include a ferromagnetic material.

According to example embodiments, there is provided an embedded device. The embedded device may include a substrate, a lower insulation structure, a first conductive pattern, MTJ modules, a second conductive pattern, an insulating interlayer structure, and magnetic field shielding structures. The substrate may include an MRAM region and a logic device region. The substrate may include a cell block region in the MRAM region. The lower insulation structure may be formed on the substrate. The first conductive pattern may be formed on the lower insulation structure in the cell block region. The MTJ modules may be formed on the first conductive pattern. Each of the MTJ modules may include MTJ pattern. The second conductive pattern may be formed on each of the MTJ modules. The insulating interlayer structure may be formed on the first conductive pattern to cover the first conductive pattern, the MTJ modules and the second conductive pattern. The magnetic field shielding structures may be disposed adjacent to the outside of the cell block region. The magnetic field shielding structures may be formed in the insulating interlayer structure. Each of the magnetic field shielding structures may extend in a vertical direction to face at least from an upper end of the MTJ pattern to a lower end of the MTJ pattern. Each of the magnetic field shielding structures may include a ferromagnetic material. The magnetic field shielding structure may have a pillar shape. The magnetic field shielding structure may have a sidewall slope in a cross-sectional view, such that an upper diameter of the magnetic field shielding structure and a lower diameter of the magnetic field shielding structure are different from each other.

According to example embodiments, there is provided an embedded device. The embedded device may include a substrate, MTJ modules, an insulating interlayer structure, and magnetic field shielding structures. The substrate may include an MRAM region. The substrate may include a cell block region within the MRAM region. The MTJ modules may be formed on the cell block region of the substrate. Each of the MTJ modules may include a MTJ pattern. The insulating interlayer structure may cover the MTJ modules. A plurality of magnetic field shielding structures may be formed in the insulating interlayer structure. Each of the magnetic field shielding structures may have a pillar shape. Each of the magnetic field shielding structures may extend in a vertical direction to face at least an upper end of the MTJ pattern to a lower end of the MTJ pattern. The plurality of magnetic field shielding structures may be arranged to have a ring shape surrounding an outside of the cell block region.

BRIEF DESCRIPTION OF THE DRAWINGS

Features will become apparent to those of skill in the art by describing in detail exemplary embodiments with reference to the attached drawings, in which.

DESCRIPTION OF EMBODIMENTS

Hereinafter, two directions parallel to a substrate and perpendicular to each other are referred to as a first direction and a second direction, respectively. A direction perpendicular, e.g., normal, to a surface of the substrate is referred to as a vertical direction.

Figure 1:
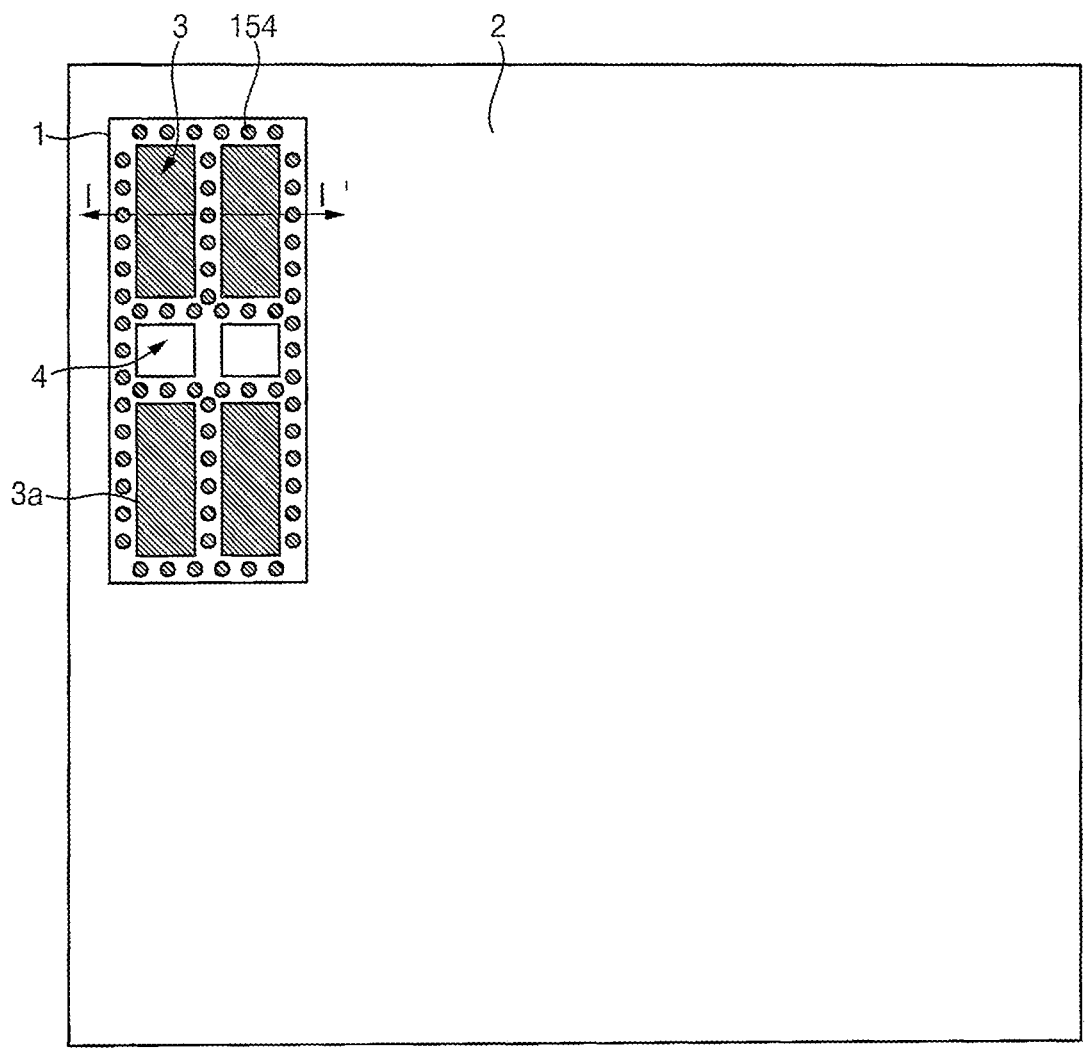
FIG. 1 is a plan view of an embedded device in accordance with example embodiments.
Figure 2:
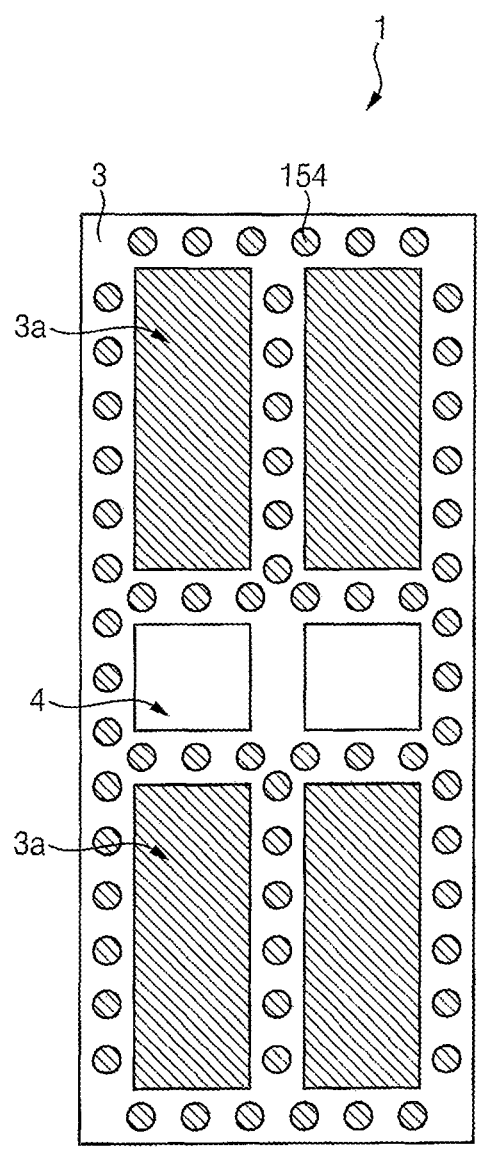
FIG. 2 is an enlarged plan view of magnetic field shielding structures in an MRAM region of an embedded device in accordance with example embodiments.
Figure 3:
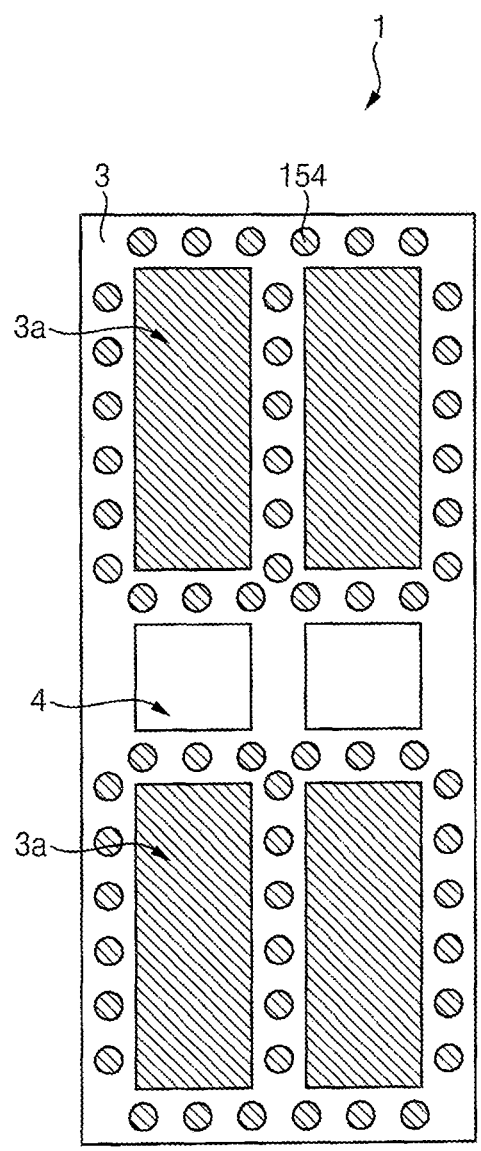
FIG. 3 is an enlarged plan view of magnetic field shielding structures in an MRAM region of an embedded device in accordance with example embodiments.

FIG. 1 is a plan view of an embedded device in accordance with example embodiments. FIG. 2 is an enlarged plan view illustrating an example of an arrangement of magnetic field shielding structures in an MRAM region of an embedded device in accordance with example embodiments. FIG. 3 is an enlarged plan view illustrating another example of an arrangement of magnetic field shielding structures in an MRAM region of an embedded device in accordance with example embodiments.

Figure 4:
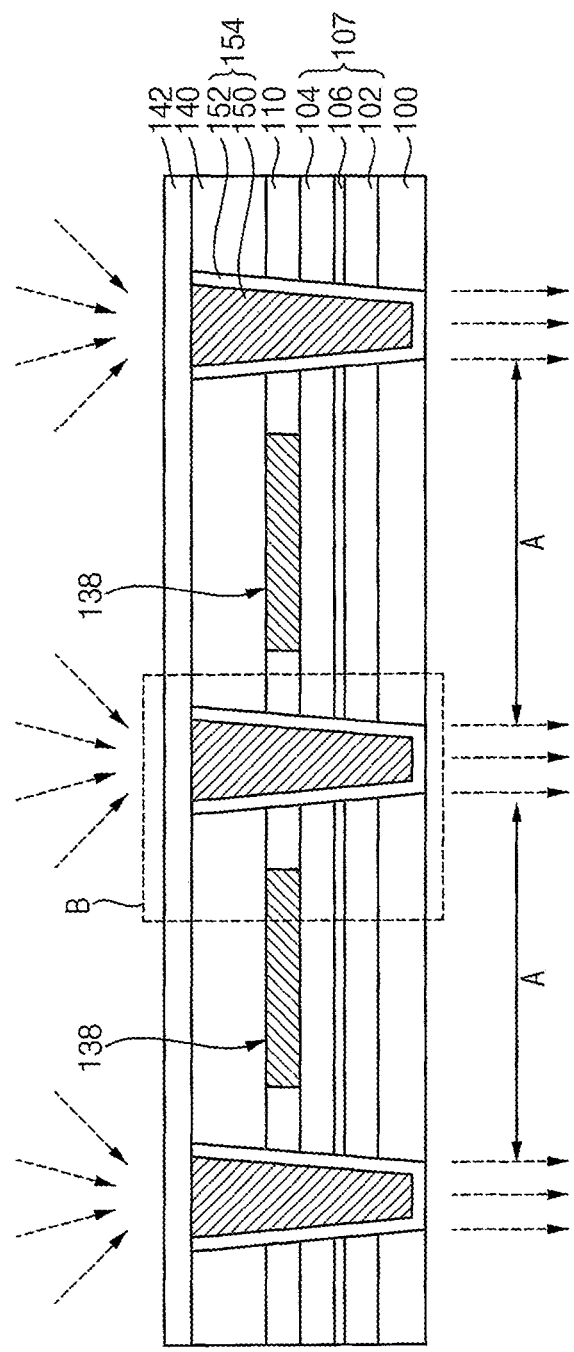
FIG. 4 is a cross-sectional view of an MRAM region in an embedded device in accordance with example embodiments.

Referring to FIG. 1, an embedded device 10 may include an MRAM region 1 and a logic device region 2. The MRAM region 1 and the logic device region 2 may be on a substrate 100 (FIG. 4).

An array of cells of a vertical STT-MRAM (hereinafter referred to as MRAM cells) may be formed in the MRAM region 1. Logic circuits may be formed in the logic device region 2. In the embedded device 10, a horizontal area, e.g., as viewed in a plan view, of the MRAM region 1 may be smaller than a horizontal area of the logic device region 2. In example embodiments, the horizontal area of the MRAM region 1 in the embedded device 10 may be less than about 40% of a total horizontal area of the embedded device 10.

The MRAM region 1 may include a memory cell region 3 and a core/peripheral region 4. The memory cell region 3 may include MTJ modules constituting the MRAM cells, and the core/peripheral region 4 may not include the MTJ modules.

Data may be stored in each of the MTJ modules. The data stored in the MTJ module may be potentially changed due to an influence of an external magnetic field, and thus an operation failure may occur. Therefore, an embedded device, of which external magnetic fields applied to the MTJ modules may be effectively shielded, is required.

A plurality of cell block regions 3a, in which the memory cell array is formed, may be disposed in the memory cell region 3. Further, a magnetic field shielding structure 154 may be disposed adjacent to an outside of the cell block regions 3a in the memory cell region 3. For example, as shown in FIG. 1, the memory cell region 3 may include four cell block regions 3a.

Referring to FIGS. 2 and 3, the magnetic field shielding structure 154 may have a pillar shape. A plurality of the magnetic field shielding structures 154 may be disposed in the memory cell region 3 to be spaced apart from each other. The magnetic field shielding structures 154 may be arranged in a ring shape, e.g., circular or rectangular shape, to surround the outside of each of the cell block regions 3a, e.g., the magnetic field shielding structures 154 may be arranged to surround a perimeter of each of the cell block regions 3a.

For example, as shown in FIG. 2, some of the magnetic field shielding structures 154 may also be disposed adjacent to the core/peripheral region 4. In another example, as shown in FIG. 3, the magnetic field shielding structures 154 may only be disposed adjacent to the cell block regions 3a.

Hereinafter, the MRAM region 1 is described in more detail with reference to FIGS. 4 to 7.

Figure 5:
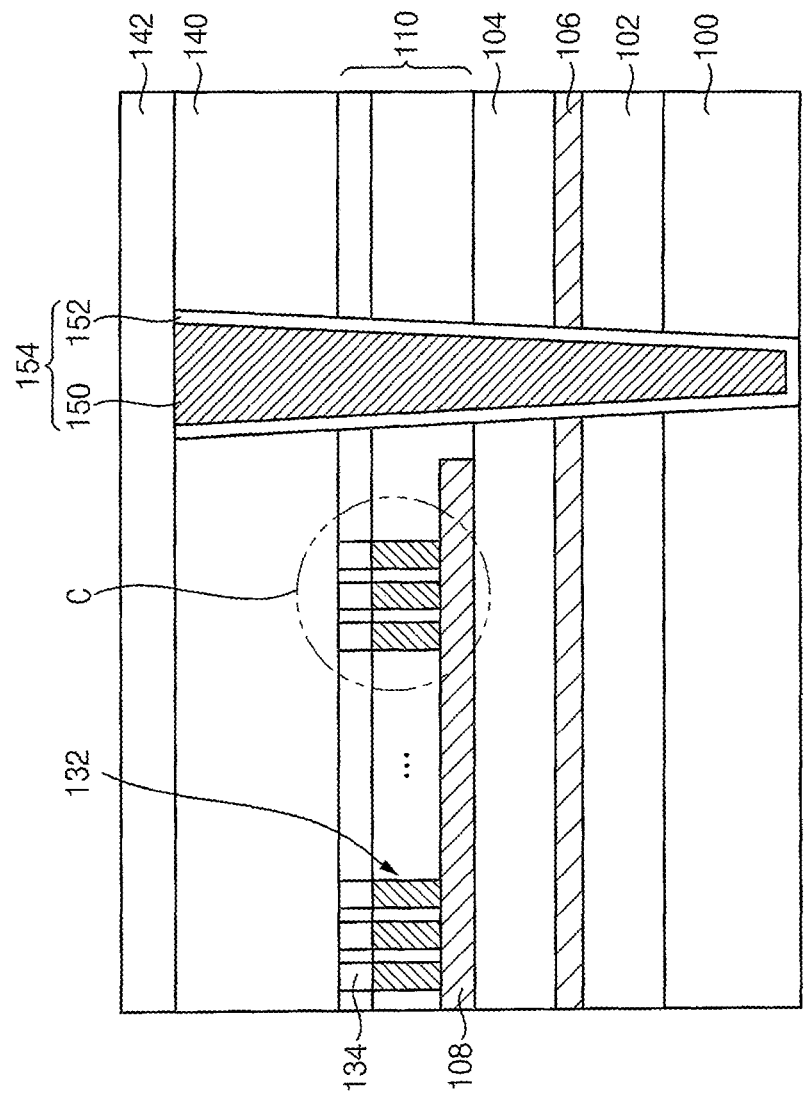
FIG. 5 is an enlarged cross-sectional view illustrating a portion of an MRAM region in an embedded device in accordance with example embodiments.
Figure 6:
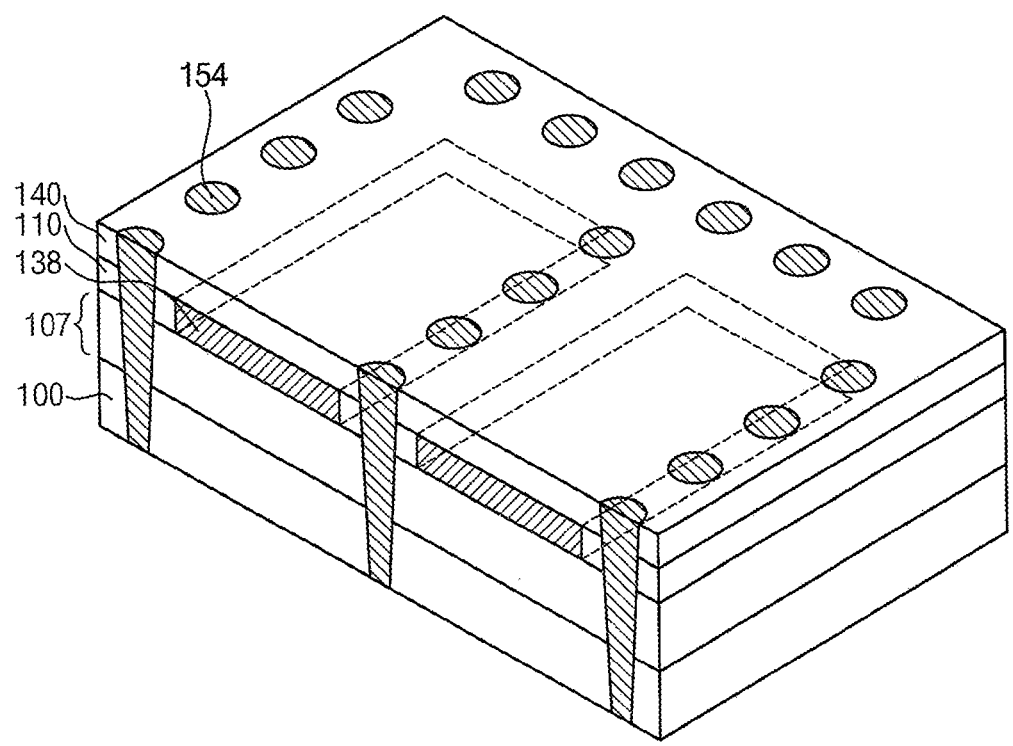
FIG. 6 is a cutaway perspective view illustrating an MRAM region in an embedded device in accordance with example embodiments.
Figure 7:
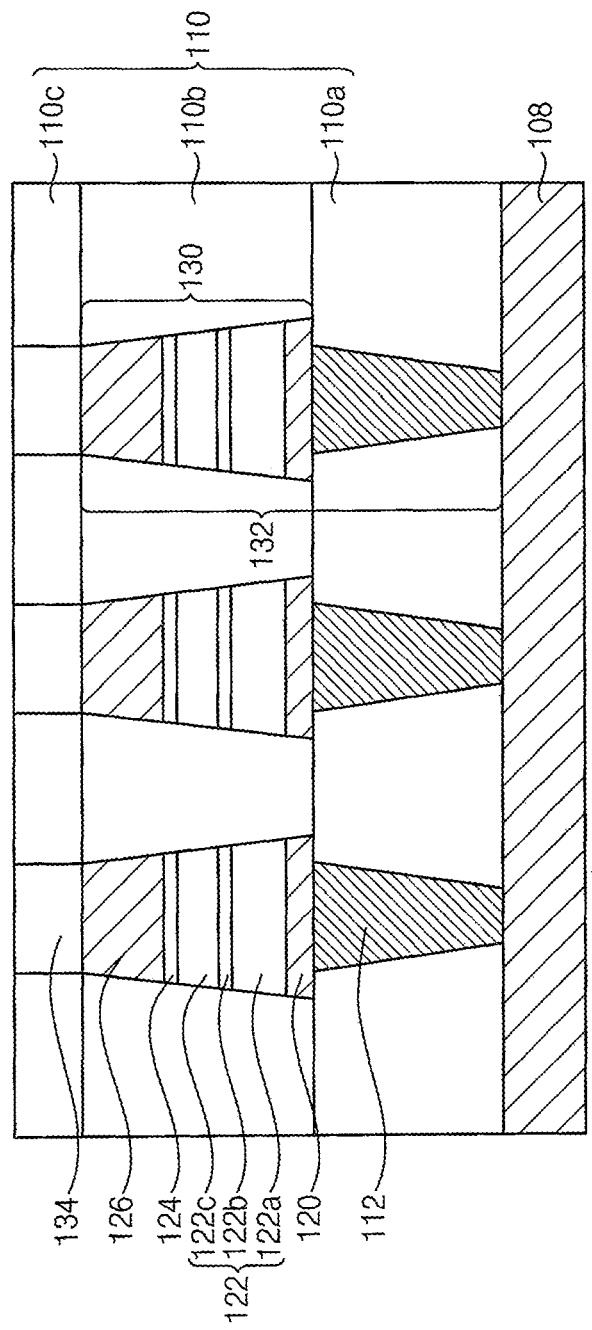
FIG. 7 is an enlarged cross-sectional view of an MTJ module included in an MRAM region in accordance with example embodiments.

FIG. 4 is a cross-sectional view of the MRAM region 1 along line I-I' of FIG. 1. FIG. 5 is an enlarged cross-sectional view of region B of FIG. 4. FIG. 6 is a cutaway perspective view of the MRAM region 1. FIG. 7 is an enlarged cross-sectional view of portion C of FIG. 5, illustrating an MTJ module included in the MRAM region 1. In order to avoid complication of the drawings, elements beside the magnetic field shielding structure 154 are omitted or shown briefly, in FIGS. 4 to 6.

Referring to FIGS. 4 to 7, circuit patterns may be formed on the substrate 100 including the MRAM region 1 and the logic device region 2, and a lower insulation structure 107 including a plurality of layers may be formed to cover the circuit patterns. The lower insulation structure 107 may include lower insulation layers 102 and 104, and a lower etch stop layer 106 between the lower insulation layers 102 and 104. First lower wirings may be formed in the lower insulation layers 102 and 104. In the description that follows, the lower insulation layers 102 and 104 may include a first lower insulation layer 102 and a second lower insulation layer 104, and the lower etch stop layer 106 may be disposed between the first and second lower insulation layers 102 and 104.

The substrate 100 may include silicon, germanium, silicon-germanium, or a group III-V compound such as GaP, GaAs, or GaSb. The circuit patterns formed on the MRAM region 1 of the substrate 100 may include a selection transistor constituting a memory cell and transistors constituting a peripheral circuit. The circuit pattern formed on the logic device region 2 of the substrate 100 may include transistors constituting the logic circuit.

In example embodiments, the first and second lower insulation layers 102 and 104 may include silicon oxide. In example embodiments, the lower etch stop layer 106 may include silicon nitride or silicon carbonitride. The first lower wirings may include a contact plug and a conductive pattern. The first lower wirings may include polysilicon or metal.

A first conductive pattern 108 may be formed on the second lower insulation layer 104. The first conductive pattern 108 may have a line shape. The first conductive pattern 108 may be formed in a cell block region of a memory cell region. The first conductive pattern 108 may serve as a word line electrically connected to a gate of the selection transistor. The first conductive pattern 108 may include a metal.

An MTJ module 132 may be formed on the first conductive pattern 108. A structure formed on the first conductive pattern 108 is described with reference to FIG. 7.

Referring to FIG. 7, a first insulating interlayer 110a may be stacked on the second lower insulation layer 104 and the first conductive pattern 108. The first insulating interlayer 110a may include an oxide, e.g., silicon oxide.

Lower electrode contacts 112 may pass through the first insulating interlayer 110a, and may contact an upper surface of the first conductive pattern 108. The lower electrode contacts 112 may be regularly disposed to be spaced apart from each other, e.g., upper surfaces of the lower electrode contacts 112 and the first insulating interlayer 110a may be coplanar. In example embodiments, the lower electrode contact 112 may include a barrier pattern and a metal pattern.

An MTJ structure 130 may be formed on each of the lower electrode contacts 112. The MTJ structure 130 may be formed on the lower electrode contact 112 and portions of the first insulating interlayer 110a adjacent to the lower electrode contact 112. The MTJ structure 130 may cover an, e.g., entire, upper surface of the lower electrode contact 112.

The MTJ structure 130 may have a pillar shape including a lower electrode 120, an MTJ pattern 122, a middle electrode 124, and an upper electrode 126 sequentially stacked. A stacked structure including the lower electrode contact 112 and the MTJ structure 130 may serve as the MTJ module 132. In some example embodiments, a middle electrode may not be included in the MTJ structure 130.

The lower electrode 120 may include a metal, e.g., titanium and/or tantalum, or a metal nitride, e.g., titanium nitride and/or tantalum nitride. The middle electrode 124 and the upper electrode 126 may include a same material as the lower electrode 120.

The MTJ pattern 122 may include a first magnetic pattern 122a, a tunnel barrier pattern 122b, and a second magnetic pattern 122c stacked. In example embodiments, the first magnetic pattern 122a may serve as a pinned layer having a fixed magnetization direction, and the second magnetic pattern 122c may serve as a free layer having a variable magnetization direction. The magnetization direction of the second magnetic pattern 122c may be perpendicular to the upper surface of the substrate 100.

In example embodiments, the tunnel barrier pattern 122b may include a metal oxide having insulation. For example, the tunnel barrier pattern 122b may include magnesium oxide ($MgO_x$) or aluminum oxide ($AlO_x$).

The magnetization direction of the second magnetic pattern 122c may be changed by spin polarized programming currents. The magnetization directions of the first and second magnetic patterns 122a and 122c may be the same directions as each other to have low electrical resistance (i.e., "0" state) in the MTJ pattern 122 by the programming currents. Alternatively, the magnetization directions of the first and second magnetic patterns 122a and 122c may be opposite directions to each other to have high electrical resistance (i.e., "1" state) in the MTJ pattern 122 by the programming currents. A resistance state of the MTJ pattern 122 may be determined by change of the magnetization direction of the second magnetic pattern 122c, and thus data may be read and written in the MRAM cell (i.e., the MTJ module).

The programming currents may be applied to each of MRAM cells to a write operation in the MRAM cells. When the second magnetic pattern 122c of the MRAM cell is magnetized according to a spin polarity of the programming currents, the MRAM cell may have a programmed state.

However, when external magnetic fields are applied to the MRAM cell, the magnetic moment of the second magnetic pattern 122c in the MRAM cell may be affected. That is, the magnetization direction of the second magnetic pattern 122c in the MRAM cell may be undesirably changed by the external magnetic field, and thus operation failure in which stored data may be changed may occur.

Particularly, in the case of a vertical STT-MRAM cell in which the magnetization directions of the first and second magnetic patterns 122a and 122c are perpendicular to a surface of the substrate 100, the vertical STT-MRAM cell may be greatly affected by external magnetic fields applied to a direction oblique to the surface of the substrate 100. That is, data stored in the MRAM cell may be more easily changed by the external magnetic fields applied to the direction oblique to the surface of the substrate 100 than external magnetic fields applied in a direction perpendicular or horizontal to the surface of the substrate 100. Particularly, when external magnetic fields are applied in a direction having an angle of 45 degrees to the surface of the substrate, failures of operation of the MRAM cell may frequently occur. Accordingly, when the external magnetic fields applied in the oblique direction to the surface of the substrate 100 are effectively shielded, the failures of operation of the MRAM cell may be decreased.

A second insulating interlayer 110b may be formed, e.g., directly, on the first insulating interlayer 110a to fill a space between the MTJ structures 130. An upper surface of the second insulating interlayer 110b may be coplanar with an upper surface of the MTJ structure 130, e.g., with an upper surface of the upper electrode 126.

A second conductive pattern 134 may be formed on the MTJ structure 130, e.g., on the upper electrode 126. The second conductive pattern 134 may serve as a bit line. The second conductive pattern 134 may extend in a direction perpendicular to an extension direction of the first conductive pattern 108 serving as a lower word line, e.g., the first conductive pattern 108 and the second conductive pattern 134 may extend perpendicularly to each other in the first and second directions, respectively, in parallel to the substrate 100.

A third insulating interlayer 110c may be formed, e.g., directly, on the second insulating interlayer 110b to fill a space between the second conductive patterns 134. The first to third insulating interlayers 110a, 110b, and 110c may include the same material, and thus may be merged to the insulating interlayer structure 110, e.g., the first to third insulating interlayers 110a, 110b, and 110c may be merged into a single and uniform insulating interlayer structure that fills the space above the first conductive pattern 108 between adjacent ones of the stacks of MTJ modules 132 and second conductive patterns 134.

In order to avoid the complexity of the drawings, in FIGS. 4 and 6, the structure including the MTJ module formed between the second lower insulation layer 104 and a fourth insulating interlayer 140 in the cell block region is simply denoted by reference numeral 138. In order to avoid complication of the drawings, in FIG. 5, the MTJ modules 132 including the lower electrode contact 112 and the MTJ structure 130 in the cell block region are schematically illustrated.

A fourth insulating interlayer 140 may be formed on the third insulating interlayer 110c and the second conductive pattern 134. In example embodiments, as shown in FIG. 5, the magnetic field shielding structure 154 may pass through the fourth insulating interlayer 140, the insulating interlayer structure 110, the second lower insulation layer 104, the lower etch stop layer 106, the first lower insulation layer 102, and the substrate 100.

In detail, as described previously with reference to FIGS. 1-3, the magnetic field shielding structures 154 may be disposed adjacent to the outside of the cell block region 3a to surround the cell block region 3a. As illustrated in FIG. 5, the magnetic field shielding structure 154 may be disposed to face the MTJ pattern 122, which is a portion where data is written in the MRAM cell. The magnetic field shielding structure 154 may extend in the vertical direction to face at least from an upper end to a lower end of the MTJ pattern 122. For example, the magnetic field shielding structure 154 may extend in the vertical direction so as to face from an upper end to a lower end of the MTJ module 132, e.g., the magnetic field shielding structure 154 may extend continuously from the top of the fourth insulating interlayer 140 to the bottom of the substrate 100 to overlap in the horizontal direction the entire vertical length of the MTJ module 132.

The magnetic field shielding structure 154 may fill a through hole passing through the fourth insulating interlayer 140, the insulating interlayer structure 110, the second lower insulation layer 104, the lower etch stop layer 106, the first lower insulation layer, and the substrate 100. For example, upper surfaces of the magnetic field shielding structure 154 and the fourth insulating interlayer 140 may be coplanar. A capping layer 142 may be formed on, e.g., the upper surfaces of, the magnetic field shielding structure 154 and the fourth insulating interlayer 140.

The magnetic field shielding structure 154 may include a ferromagnetic pattern 150. A material of the ferromagnetic pattern 150 may include a high permeability ferromagnetic metal. The material of the ferromagnetic pattern 150 may include, e.g., at least one of nickel (Ni), iron (Fe), cobalt (Co), and an alloy composed of at least two of nickel (Ni), iron (Fe), and cobalt (Co). The material of the ferromagnetic pattern 150 may include, e.g., NiFe, Co, Fe, NiFeCo, or CoFe.

In example embodiments, the magnetic field shielding structure 154 may further include a seed layer pattern 152 surrounding the surface of the ferromagnetic pattern 150. That is, the seed layer pattern 152 may be formed, e.g., conformally, on a surface of the through hole, e.g., and the ferromagnetic pattern 150 may be formed on the seed layer pattern 152 to fill the remainder of the through hole. The seed layer pattern 152 may include, e.g., aluminum oxide. As the seed layer pattern 152 is formed, an adhesive property of the ferromagnetic pattern 150 may be improved.

The magnetic field shielding structure 154 may have a ferromagnetic material, so that surrounding external magnetic fields may be concentrated and collected to the magnetic field shielding structure 154, as indicated by an arrow in FIG. 4. In addition, the external magnetic fields collected to the magnetic field shielding structure 154 may pass through the magnetic field shielding structure 154, and may exit in a traveling direction. Thus, the external magnetic fields around the magnetic field shielding structure 154 may be decreased. For example, a region A positioned between the magnetic field shielding structures 154 may serve as a magnetic field reduction region in which the magnetic fields are greatly reduced as the external magnetic fields are shielded in both sides of the region A. The cell block region 3a may be disposed in the magnetic field reduction region, i.e., in the region A, between the magnetic field shielding structures 154. An influence of the external magnetic fields in the MRAM cells formed in each of the cell block regions 3a may be decreased by the magnetic field shielding structure 154.

The magnetic field shielding structure 154 may not be provided as an electrical connection structure. Therefore, an electrical connection wiring may not be connected to the magnetic field shielding structure 154, e.g., the magnetic field shielding structure 154 may be completely surrounded by insulating layers.

In a cross-sectional view, as illustrated in FIGS. 4 and 5, the magnetic field shielding structure 154 may have a sidewall slope, e.g., a sidewall inclined at an oblique angle with respect to the bottom of the substrate 100. In the magnetic field shielding structure 154, an inner width of an upper portion and an inner width of a lower portion may be different from each other. For example, the upper portion of the magnetic field shielding structure 154 may have a first inner width, and the inner width of the magnetic field shielding structure 154 may gradually decrease from the upper portion to the lower portion, e.g., in a direction oriented from the fourth insulating interlayer 140 toward the substrate 100.

The magnetic field shielding structure 154 may have a pillar shape. In the magnetic field shielding structure 154, an upper diameter and a lower diameter may be different from each other. In example embodiments, the upper portion of the magnetic field shielding structure 154 may have a first diameter, and the diameter of the magnetic field shielding structure 154 may gradually decrease from the upper portion to the lower portion. Thus, the lower portion of the magnetic field shielding structure 154 may have a second diameter smaller than the first diameter. The magnetic field shielding structure 154 may have the upper diameter greater than the lower diameter.

Thus, when external magnetic fields are applied to the upper portion of the magnetic field shielding structure 154, the external magnetic fields may be effectively concentrated and collected in the magnetic field shielding structure 154 and the external magnetic fields may be effectively shielded. As the upper diameter of the magnetic field shielding structure 154 is increased, the external magnetic fields having an oblique angle with respect to the substrate 100 applied to the upper portion of the magnetic field shielding structure 154 may be effectively shielded.

As described above, the magnetic field shielding structure 154 may be formed by a manufacturing process performed on the substrate 100, before a packaging process of the embedded device. As the magnetic field shielding structure 154 is disposed adjacent to the cell block region 3a in which the MRAM cells are formed, the magnetic fields may be effectively shielded. Thus, electrical failures of the MRAM cells due to the external magnetic fields may be decreased.

In general, if the magnetic field shielding structure is formed during the packaging process of the embedded device, the magnetic field shielding structure may cover the entire embedded device. Thus, a size of the magnetic field shielding structure may be greater than a size of the embedded device, and a portion occupied by the magnetic field shielding structure may be greatly increased.

In contrast, according to embodiments, the magnetic field shielding structure 154 is formed before the packaging process of the embedded device, so the magnetic field shielding structure 154 may be included only in the MRAM region of the embedded device (rather than covering the entire embedded device). Therefore, a portion occupied by the magnetic field shielding structure 154 may be decreased, and the cost of forming the magnetic field shielding structure 154 may be decreased.

Hereinafter, various examples of a magnetic field shielding structure according to embodiments are described.

Figure 8:
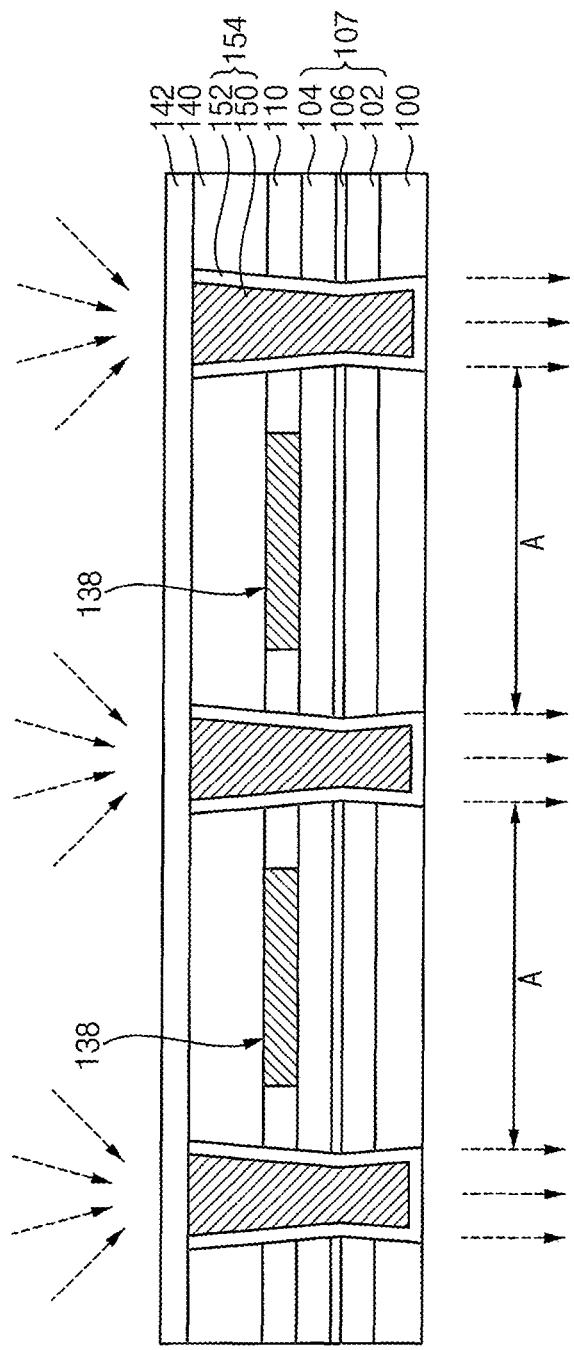
FIG. 8 is a cross-sectional view of an MRAM region in an embedded device in accordance with example embodiments.

FIG. 8 is a cross-sectional view of an MRAM region in an embedded device in accordance with example embodiments. The embedded device shown in FIG. 8 is the same as the embedded device illustrated with reference to FIGS. 1 to 7, except for a cross-sectional shape of the magnetic field shielding structure. Therefore, the cross-sectional shape of the magnetic field shielding structure will be mainly described.

Referring to FIG. 8, the magnetic field shielding structure 154 may have a pillar shape. In a cross-sectional view, the magnetic field shielding structure 154 may have a sidewall slope.

In detail, as illustrated in FIG. 8, in the magnetic field shielding structure 154, an inner width may gradually decrease from an upper portion of the magnetic field shielding structure 154 to a middle portion, and the inner width gradually increase from the middle portion to a lower portion. In the magnetic field shielding structure 154, the upper portion may have a first diameter, and a lower portion may have a second diameter. The diameter of the magnetic field shielding structure 154 may gradually decrease from the upper portion to the middle portion, and may gradually increase from the middle portion to the lower portion. The middle portion of the magnetic field shielding structure 154 may have a third diameter less than each of the first and second diameters. The upper and lower portions of the magnetic field shielding structure 154 may have diameters greater than the third diameter of the middle portion.

As both the upper and lower diameters of the magnetic field shielding structure 154 are greater than the third diameter of the middle portion, the external magnetic fields may be effectively shielded when the external magnetic fields are applied to the upper or lower portions of the magnetic field shielding structure 154. As both the upper and lower diameters of the magnetic field shielding structure 154 are greater than the third diameter of the middle portion, the external magnetic fields having an oblique angle with respect to the substrate 100 applied to the upper portion or the lower portion of the magnetic field shielding structure 154 may be effectively shielded.

The region A positioned between the magnetic field shielding structures 154 may serve as a magnetic field reduction region in which the magnetic fields are greatly reduced as the external magnetic fields are shielded from both sides of the region A. The cell block region 3a may be disposed in the magnetic field reduction region between the magnetic field shielding structures 154. The influence of the external magnetic fields in the MRAM cells formed in each of the cell block regions 3a may be decreased by the magnetic field shielding structure 154. Thus, electrical failures of the MRAM cells due to the external magnetic fields may be decreased.

Figure 9:
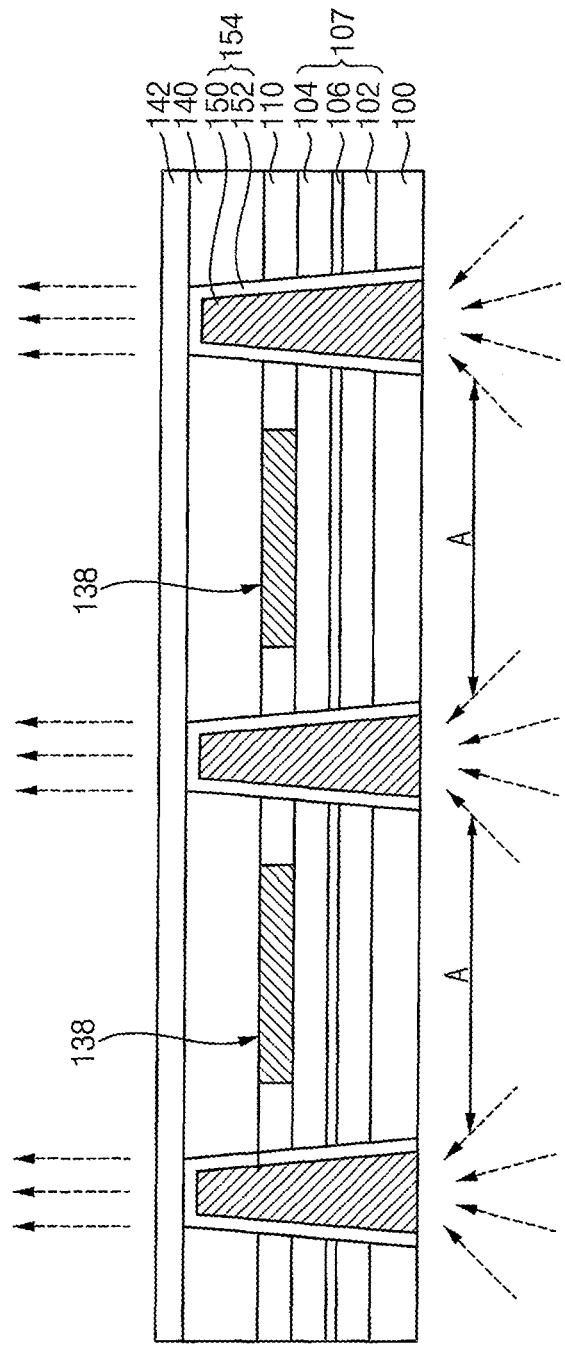
FIG. 9 is a cross-sectional view of an MRAM region in an embedded device in accordance with example embodiments.

FIG. 9 is a cross-sectional view of an MRAM region in an embedded device in accordance with example embodiments. The embedded device shown in FIG. 9 is the same as the embedded device described with reference to FIGS. 1 to 7, except for a shape of the magnetic field shielding structure. Therefore, a cross-sectional shape of the magnetic field shielding structure will be mainly described.

Referring to FIG. 9, the magnetic field shielding structure 154 may have a pillar shape. In a cross-sectional view, the magnetic field shielding structure 154 may have a sidewall slope.

In detail, as illustrated in FIG. 9, the magnetic field shielding structure 154 may include an inner width of the upper portion and an inner width of the lower portion that are different from each other. The upper portion of the magnetic field shielding structure 154 may have a first inner width, and the inner width of the magnetic field shielding structure 154 may gradually increase from the upper portion to the lower portion.

In the magnetic field shielding structure 154, an upper diameter and a lower diameter may be different from each other. In example embodiments, in the magnetic field shielding structure 154, the upper portion may have a first diameter, and the diameter of the magnetic field shielding structure 154 may gradually increase from the upper portion to the lower portion. Thus, the lower portion of the magnetic field shielding structure 154 may have a second diameter greater than the first diameter.

As the lower diameter of the magnetic field shielding structure 154 is greater than the upper diameter of the magnetic field shielding structure 154, the external magnetic fields may be effectively shielded when external magnetic fields are applied to the lower portion of the magnetic field shielding structure 154. As the lower diameter of the magnetic field shielding structure 154 is greater than the upper diameter of the magnetic field shielding structure 154, the external magnetic fields having an oblique angle with respect to the substrate 100 applied to the lower portion of the magnetic field shielding structure 154 may be effectively shielded.

Figure 10:
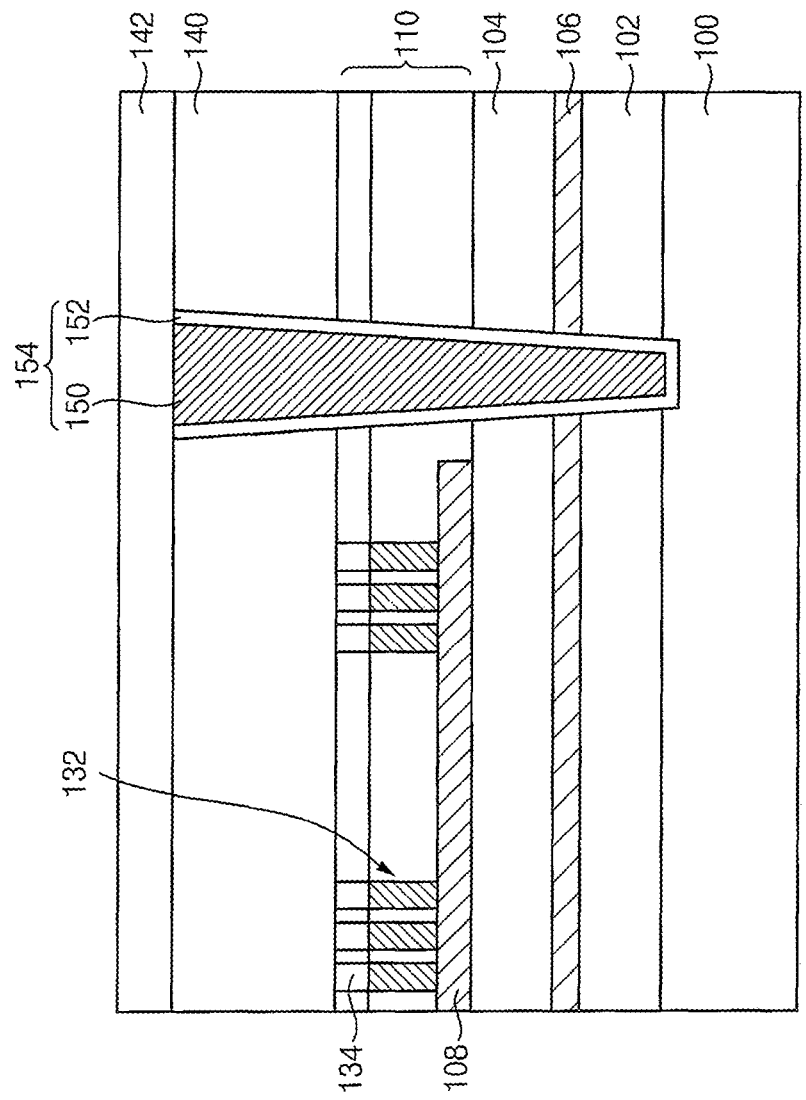
FIG. 10 is an enlarged cross-sectional view illustrating a portion of an MRAM region in an embedded device in accordance with example embodiments.

FIG. 10 is an enlarged cross-sectional view illustrating a portion of an MRAM region in an embedded device in accordance with example embodiments. The embedded device shown in FIG. 10 is the same as the embedded device described with reference to FIGS. 1 to 7, except for a position of a lower surface of the magnetic field shielding structure. Therefore, the magnetic field shielding structure will be mainly described.

The magnetic field shielding structure 154 may be disposed to face the MTJ pattern (FIGS. 7 and 122), which is a region where data is written in the MRAM cell. The magnetic field shielding structure 154 may have various shapes extending in a vertical direction to face at least from an upper end to a lower end of the MTJ pattern 122.

Referring to FIG. 10, the magnetic field shielding structure 154 may pass through the fourth insulating interlayer 140, the insulating interlayer structure 110, the second lower insulation layer 104, the lower etch stop layer 106, and the first lower insulation layer 102. The magnetic field shielding structure 154 may not pass through the, e.g., entirety of the, substrate 100. A lower surface of the magnetic field shielding structure 154 may contact the substrate 100, e.g., the lower surface of the magnetic field shielding structure 154 may partially extend into a portion of the substrate 100. The magnetic field shielding structure 154 may fill a hole passing through the fourth insulating interlayer 140, the insulating interlayer structure 110, the second lower insulation layer 104, the lower etch stop layer 106, and the first lower insulation layer 102.

The magnetic field shielding structure 154 may include the ferromagnetic pattern 150 and the seed layer pattern 152 surrounding a surface of the ferromagnetic pattern 150, e.g., only the seed layer pattern 152 may extend into the substrate 100. In some example embodiments, the magnetic field shielding structure 154 of FIG. 10 may have the sidewall slope shown in FIG. 8 or the sidewall slope shown in FIG. 9, in a cross-sectional view.

Figure 11:
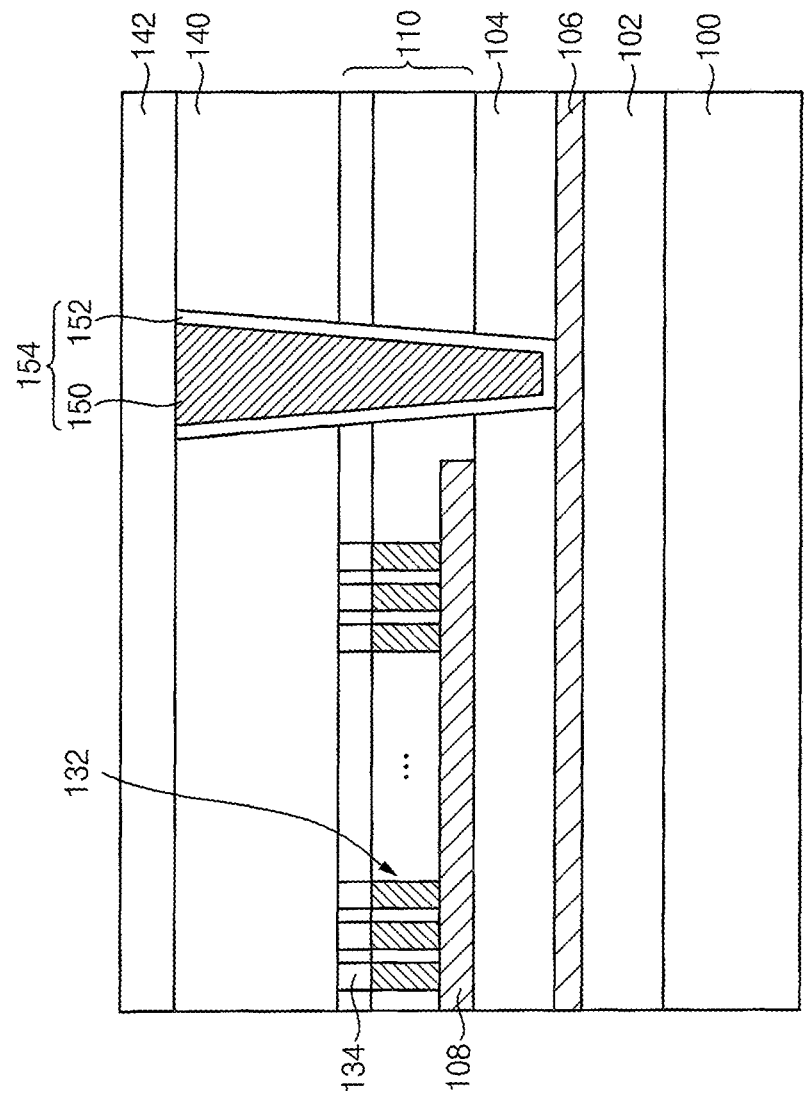
FIG. 11 is an enlarged cross-sectional view illustrating a portion of an MRAM region in an embedded device in accordance with example embodiments.

FIG. 11 is an enlarged cross-sectional view illustrating a portion of an MRAM region in an embedded device in accordance with example embodiments. The embedded device shown in FIG. 11 is the same as the embedded device described with reference to FIGS. 1 to 7, except for a lower position of the magnetic field shielding structure. Therefore, the magnetic field shielding structure will be mainly described.

Referring to FIG. 11, the magnetic field shielding structure 154 may pass through the fourth insulating interlayer 140, the insulating interlayer structure 110, and the second lower insulation layer 104, e.g., the magnetic field shielding structure 154 may extend only to an inner portion of the insulating structure surrounding the magnetic field shielding structure 154. The magnetic field shielding structure 154 may fill a hole passing through the fourth insulating interlayer 140, the insulating interlayer structure 110, and the second lower insulation layer 104 and exposing the lower etch stop layer 106. The magnetic field shielding structure 154 may not pass through the lower etch stop layer 106, the first lower insulation layer 102, and the substrate 100. A lower surface of the magnetic field shielding structure 154 may contact a surface of the lower etch stop layer 106.

The magnetic field shielding structure 154 may include the ferromagnetic pattern 150 and the seed layer pattern 152 surrounding a surface of the ferromagnetic pattern 150. In some example embodiments, the magnetic field shielding structure 154 of FIG. 11 may have the sidewall slope shown in FIG. 8 or the sidewall slope shown in FIG. 9, in a cross-sectional view.

Figure 12:
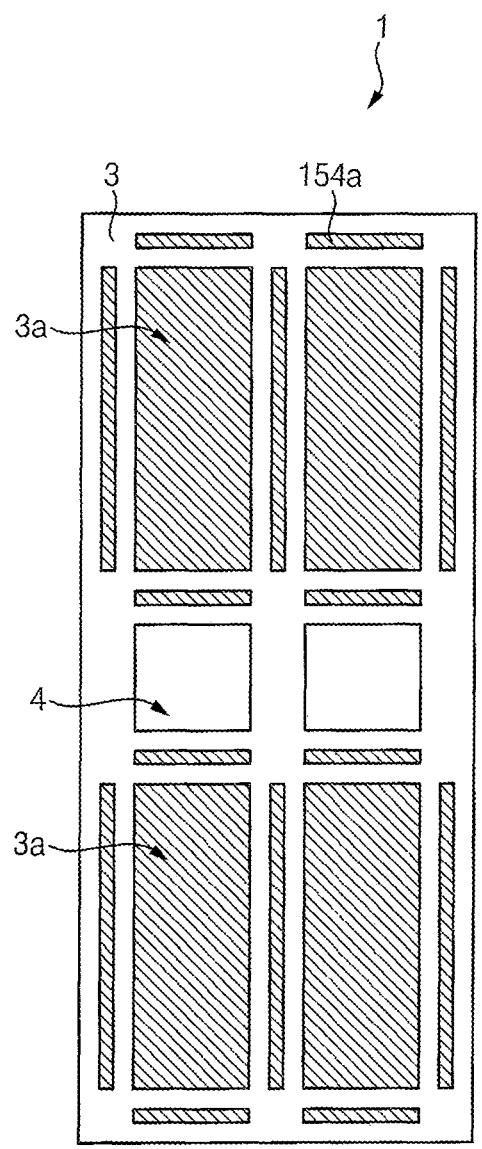
FIG. 12 is a plan view of an MRAM region in an embedded device in accordance with example embodiments.
Figure 13:
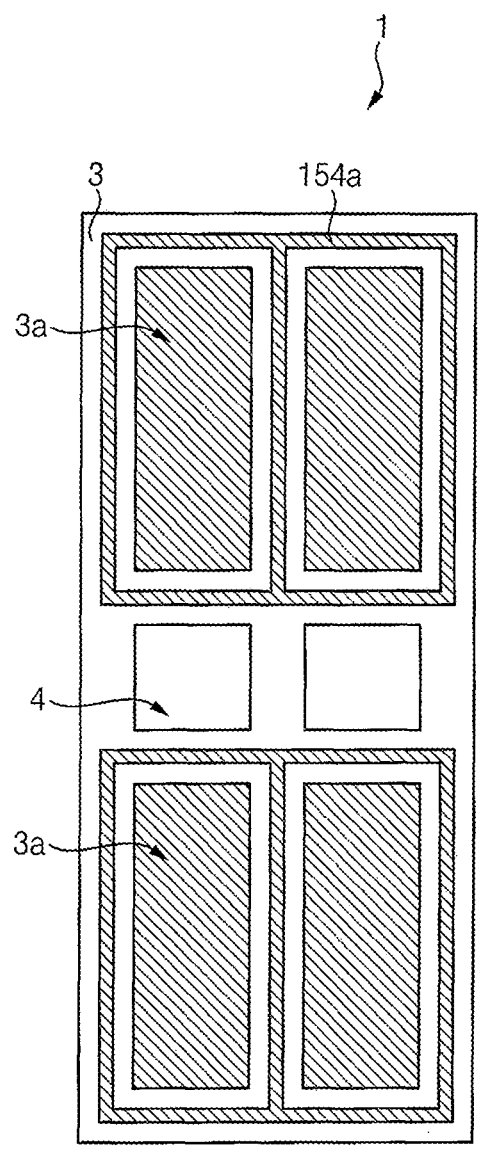
FIG. 13 is a plan view of an MRAM region in an embedded device in accordance with example embodiments.
Figure 14:
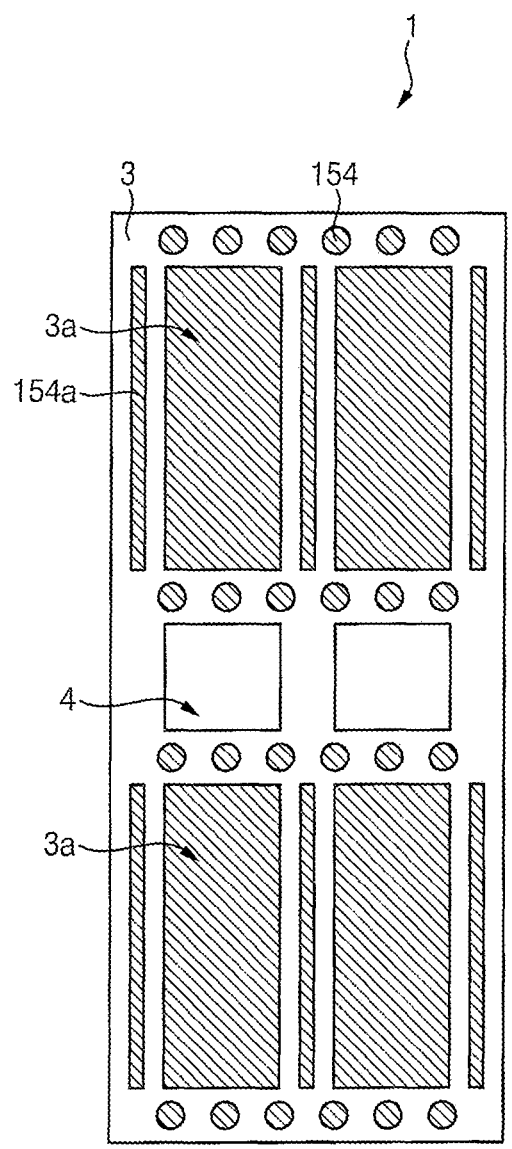
FIG. 14 is a plan view of an MRAM region in an embedded device in accordance with example embodiments; and Referring to FIGS. 15 to 23 are cross-sectional views of stages in a method of manufacturing an embedded device in accordance with example embodiments.

FIG. 12 is a plan view of an MRAM region in an embedded device in accordance with example embodiments. FIG. 13 is a plan view of an MRAM region in an embedded device in accordance with other example embodiments. FIG. 14 is a plan view of an MRAM region in an embedded device in accordance with yet other example embodiments.

The embedded devices shown in FIGS. 12 to 14 are the same as the embedded devices described with reference to FIGS. 1 to 7, except for the shape of the magnetic field shielding structure in a plan view. Therefore, the magnetic field shielding structure will be mainly described.

Referring to FIGS. 12 and 13, a linear magnetic field shielding structure 154a may fill a trench. That is, the linear magnetic field shielding structures 154a may be disposed in the trench surrounding an outside of each of the cell block regions.

For example, referring to FIG. 12, in a plan view, the linear magnetic field shielding structure 154a may be adjacent to each of the cell block regions 3a, and the linear magnetic field shielding structure 154a may have a bar shape extending in the first direction or the second direction. For example, the bar shapes extending in the first direction and the second direction may not be connected to each other, e.g., the bar shapes may be spaced apart from each other.

In another example, referring to FIG. 13, in a plan view, the linear magnetic field shielding structure 154a may be adjacent to each of cell block regions 3a, and the linear magnetic field shielding structure 154a may have a connected bar shape surrounding the outside of each of cell block regions 3a. For example, the bar shapes extending in the first direction and the second direction may be continuously with each other In yet another example, referring to FIG. 14, a portion of the magnetic field shielding structure may fill the trench, and a remaining portion of the magnetic field shielding structure may have a pillar shape. That is, the magnetic field shielding structures 154 may have a pillar shape disposed along one direction to extend along one side of each of the cell block regions 3a, and the linear magnetic field shielding structure 154a may be disposed along another direction to surround another side of each of the cell block regions 3a.

In some example embodiments, the magnetic field shielding structures 154 and the linear magnetic field shielding structures 154a may have the sidewall slopes shown in FIG. 4, the sidewall slopes shown in FIG. 8, or the sidewall slopes shown in FIG. 9, in a cross-sectional view.

In the above, the magnetic field shielding structure formed in the MRAM region in the embedded device is described. However, in a case of an MRAM-only device not embedded device, a magnetic field shielding structure having the same structure as that described above may be formed in the MRAM-only device. In the case of the MRAM-only device, the substrate may not include the logic device region, and the MRAM cells may be formed in the MRAM region of the substrate.

Hereinafter, a method of manufacturing an embedded device in accordance with example embodiments is described with reference to FIGS. 15 to 23. FIGS. 15 to 23 are cross-sectional views of stages in a method of manufacturing an embedded device in accordance with example embodiments. FIGS. 17 and 18 are enlarged cross-sectional views of an MTJ module.

Figure 15:
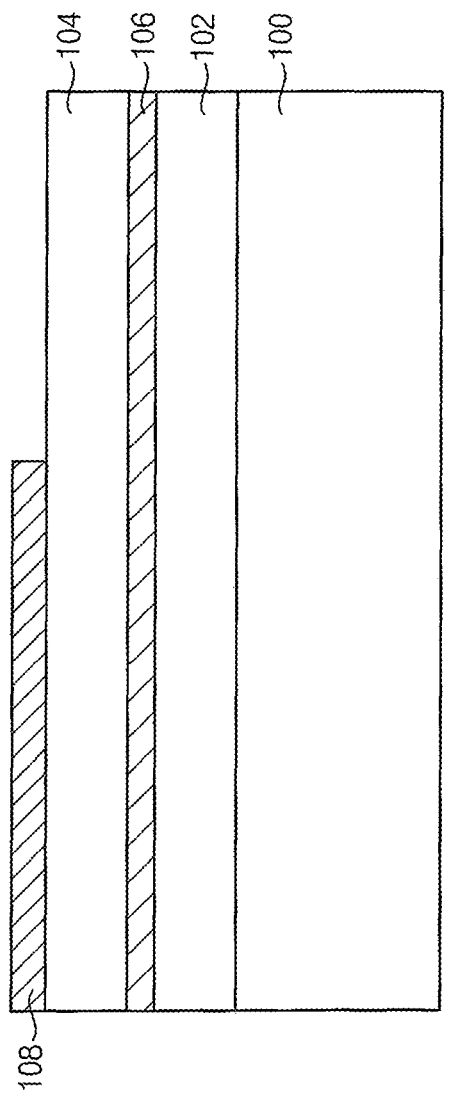

Referring to FIG. 15, selection devices constituting memory cells may be formed on a MRAM region of the substrate 100. A plurality of logic transistors constituting a logic circuit or a peripheral circuit may be formed on a logic region of the substrate 100. Hereinafter, a method of forming memory cells in the MRAM region in the embedded device is mainly described.

The first lower insulation layer 102 may be formed on the substrate 100 to cover the selection devices and the logic transistors in the substrate 100. A first lower wiring including a contact plug and a conductive pattern may be further formed in the first lower insulation layer 102.

The lower etch stop layer 106 may be formed on the first lower insulation layer 102. The second lower insulation layer 104 may be formed on the lower etch stop layer 106. A second lower wiring including a contact plug and a conductive pattern may be further formed in the second lower insulation layer 104.

The first conductive pattern 108 may be formed on the second lower insulation layer 104. In example embodiments, the first conductive pattern 108 may have a line shape extending in a first direction.

Figure 16:
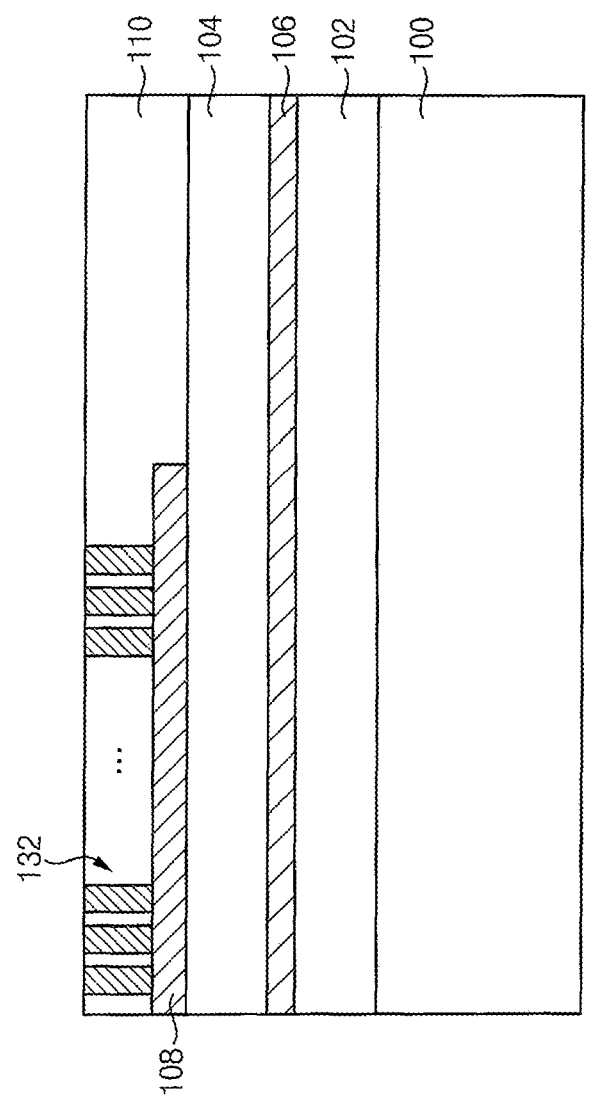
Figure 17:
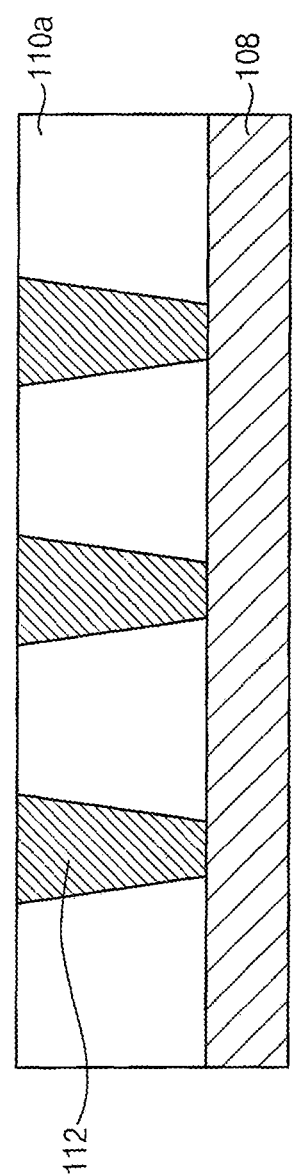
Figure 18:
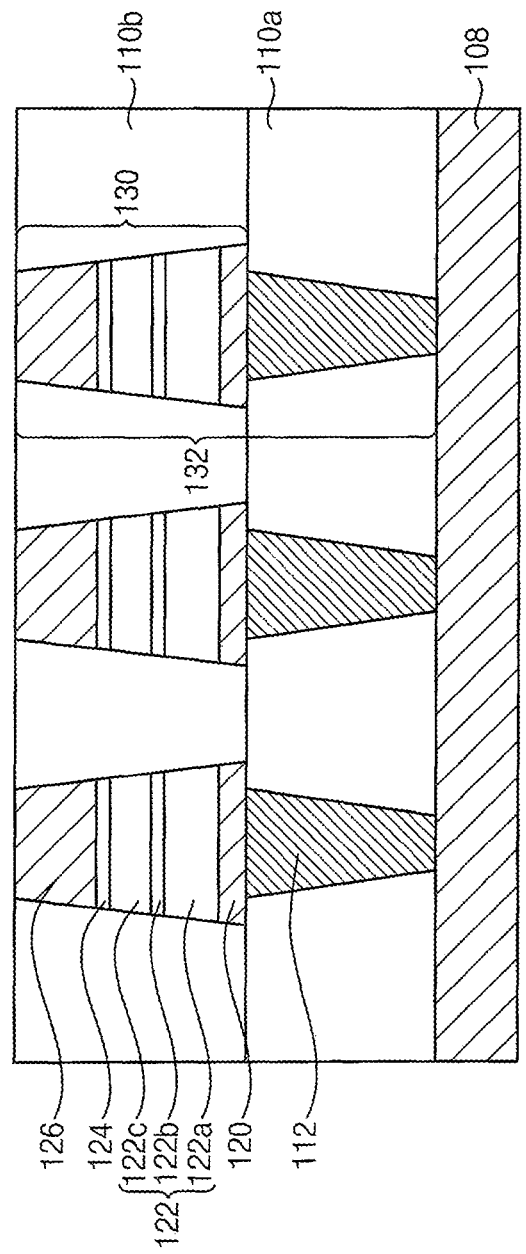

Referring to FIGS. 16 to 18, the MTJ modules 132 and the first and second insulating interlayers 110a and 110b may be formed on the second lower insulation layer 104 and the first conductive pattern 108. For example, as illustrated in FIG. 16, the MTJ modules 132 may be formed on the first conductive pattern 108, and the first and second insulating interlayers 110a and 110b may be stacked on the second lower insulation layer 104 and the first conductive pattern 108 to surround the MTJ modules 132.

In detail, referring to FIG. 17, the first insulating interlayer 110a may be formed on the second lower insulation layer 104 and the first conductive pattern 108. The first insulating interlayer 110a may include an oxide, e.g., silicon oxide.

A portion of the first insulating interlayer 110a may be etched to form via holes exposing the first conductive pattern 108. A first barrier layer and a first metal layer may be formed in the via holes and on the first insulating interlayer 110a. Then, the first metal layer and the first barrier layer may be planarized until an upper surface of the first insulating interlayer 110a may be exposed to form the lower electrode contact 112. The lower electrode contact 112 may include a barrier pattern and a metal pattern.

Referring to FIGS. 16 and 18, a lower electrode layer, an MTJ layer, a middle electrode layer, and an upper electrode layer may be sequentially formed on the first insulating interlayer 110a and the lower electrode contact 112. The MTJ layer may include a first magnetic layer, a tunnel barrier layer, and a second magnetic layer stacked. Thereafter, an etching mask pattern may be formed on the upper electrode layer. The upper electrode layer, the middle electrode layer, the MTJ layer, and the lower electrode layer may be anisotropically etched using this as an etching mask to form the MTJ structure 130. The anisotropic etching process may include a reactive ion etching (RIE) process.

The MTJ structure 130 may be formed on the first insulating interlayer 110a and the lower electrode contact 112, and the MTJ structure 130 may include the lower electrode 120, the MTJ pattern 122, the middle electrode 124, and the upper electrode 126 stacked. The lower electrode contact 112 and the MTJ structure 130 may serve as the MTJ module 132. In FIGS. 16 and 19 to 21, the MTJ module 132 is simply illustrated. The second insulating interlayer 110b may be formed on the first insulating interlayer 110a to fill a space between the MTJ structures 130.

Figure 19:
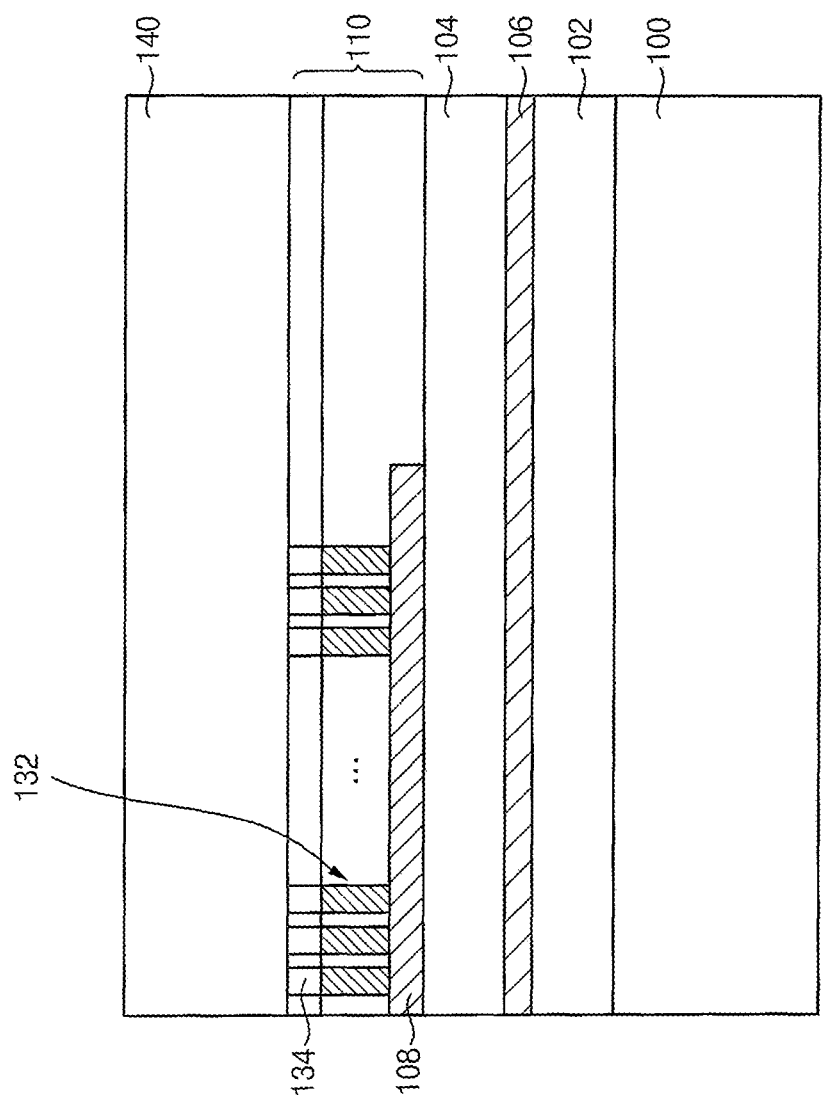

Referring to FIG. 19, the third insulating interlayer 110c (refer to FIG. 7) may be formed on the second insulating interlayer 110b and the upper electrode 126. In FIG. 19, the first to third insulating interlayers 110a, 110b, and 110c may be merged into one insulating structure to form the insulating interlayer structure 110.

The third insulating interlayer 110c may be etched to form a trench exposing the upper electrode 126 (refer to FIG. 18). A second conductive pattern 134 electrically connected to the upper electrode 126 may be formed in the trench. The second conductive pattern 134 may extend in a direction crossing the first conductive pattern 108. The second conductive pattern 134 may have a line shape extending in a second direction perpendicular to the first direction. The fourth insulating interlayer 140 may be formed on the third insulating interlayer 110c and the second conductive pattern 134 to cover the second conductive pattern. A structure including the MTJ module 132 may be disposed in each of cell block regions of the MRAM region.

Figure 20:
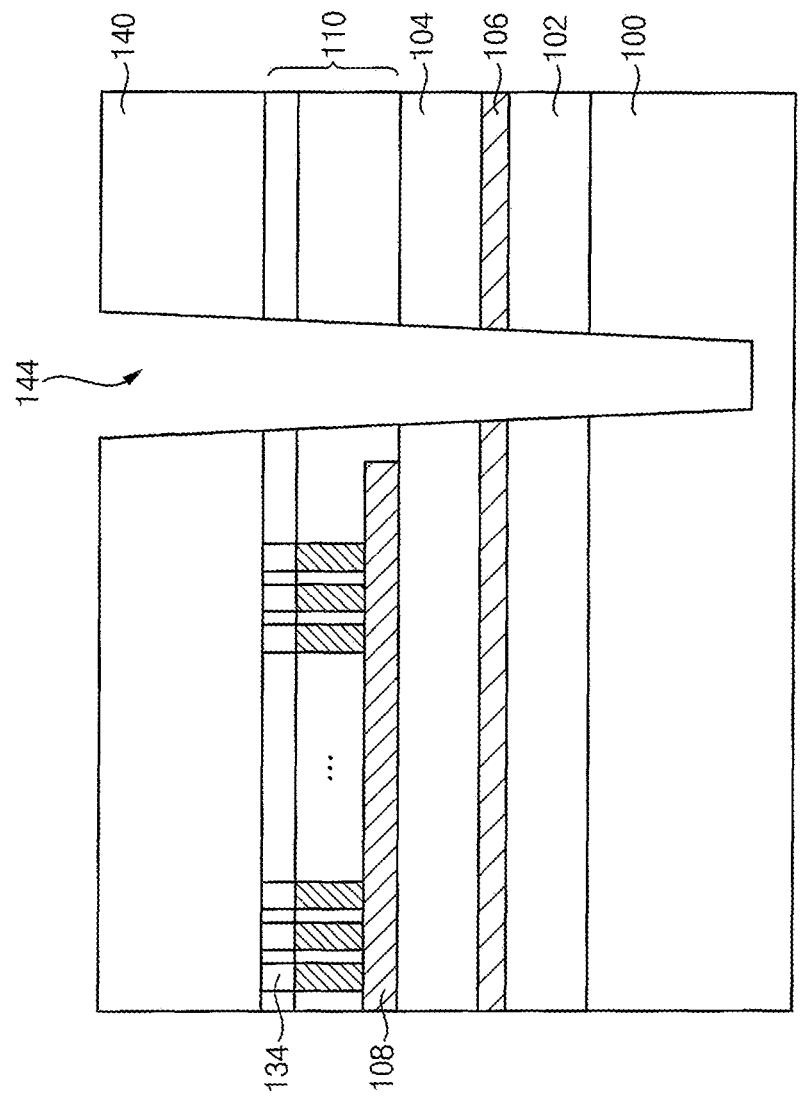
Figure 21:
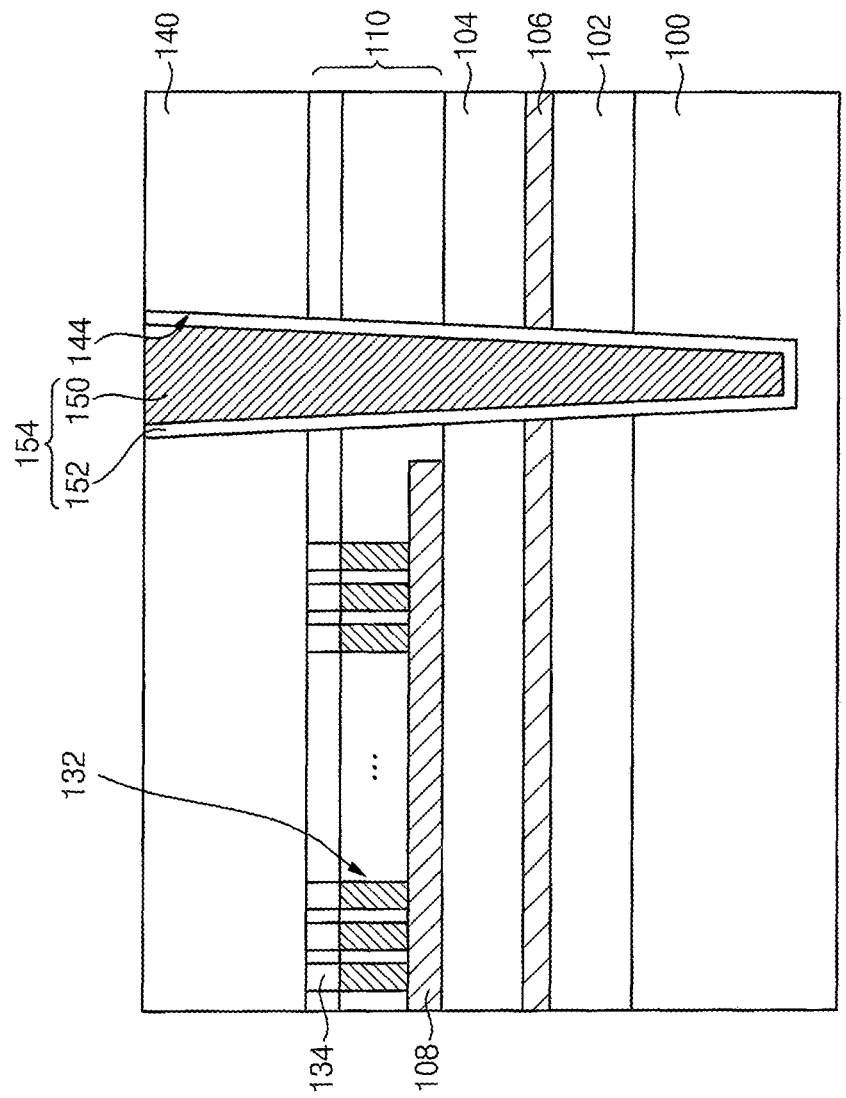

Referring to FIGS. 20 and 21, the fourth insulating interlayer 140, the insulating interlayer structure 110, the second lower insulation layer 104, the lower etch stop layer 106, the first lower insulation layer 102, and the substrate 100 positioned adjacent to an edge of the cell block region may be etched to form holes 144. Each of the holes 144 may have a sidewall slope. Thus, a diameter of an upper portion of the hole 144 and a diameter of a lower portion of the hole 144 may be different from each other. In example embodiments, the upper portion of the hole 144 may have a first diameter, and the diameter may gradually decrease from the upper portion to the lower portion. Thus, the lower portion of the hole 144 may have a second diameter smaller than the first diameter.

A seed layer may be conformally formed on an upper surface of the fourth insulating interlayer 140 and surfaces of the holes 144. The seed layer may include aluminum oxide. A ferromagnetic layer may be formed on the seed layer to fill the holes 144. The ferromagnetic layer may include nickel (Ni), iron (Fe), cobalt (Co), or alloys of nickel (Ni), iron (Fe), and cobalt (Co). The ferromagnetic layer may include, e.g., NiFe, Co, Fe, NiFeCo or CoFe.

Thereafter, the seed layer and the ferromagnetic layer may be planarized until the upper surface of the fourth insulating interlayer 140 is exposed to form a magnetic field shielding structure 154. The magnetic field shielding structure 154 may include the seed layer pattern 152 and the ferromagnetic pattern 150.

In some example embodiments, the magnetic field shielding structure illustrated in FIG. 10 or FIG. 11 may be formed by changing the etched layers in the process of forming the holes 144. For example, the fourth insulating interlayer 140, the insulating interlayer structure 110, the second lower insulation layer 104, the lower etch stop layer 106, and the first lower insulation layer 102 disposed adjacent to an edge of the cell block region may be etched to form a hole. In this case, the seed layer pattern 152 and the ferromagnetic pattern 150 may be formed in the hole, so that the magnetic field shielding structure shown in FIG. 10 may be formed. In another example, the fourth insulating interlayer 140, the insulating interlayer structure 110, and the second lower insulation layer 104 may be etched to form a hole exposing an upper surface of the lower etch stop layer 106. In this case, the seed layer pattern 152 and the ferromagnetic pattern 150 may be formed in the hole, so that the magnetic field shielding structure shown in FIG. 11 may be formed.

In some example embodiments, in the etching process, an opening having a trench extending in a direction may be formed. In this case, the magnetic field shielding structure having the plan view shown in FIG. 12 or FIG. 13 may be formed depending on a shape of the trench.

Figure 22:
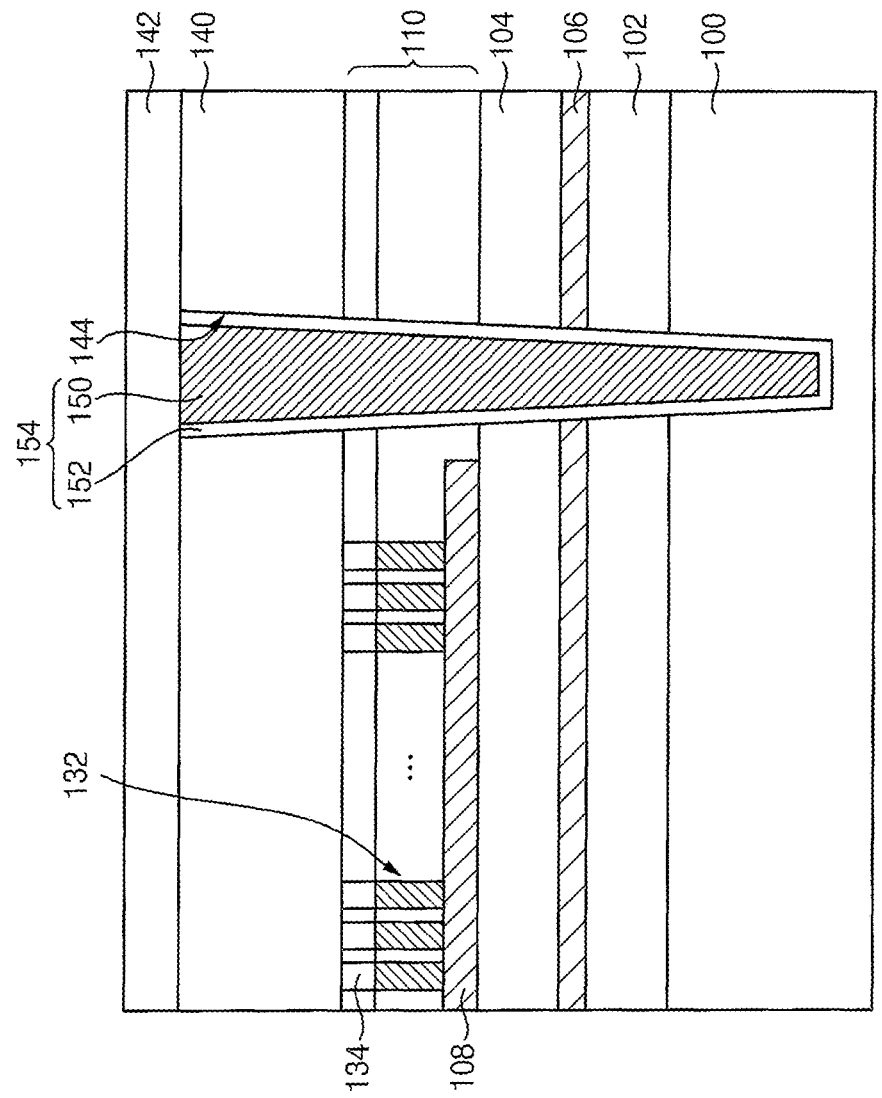

Referring to FIG. 22, the capping layer 142 may be formed on the magnetic field shielding structure 154 and the fourth insulating interlayer 140.

Figure 23:
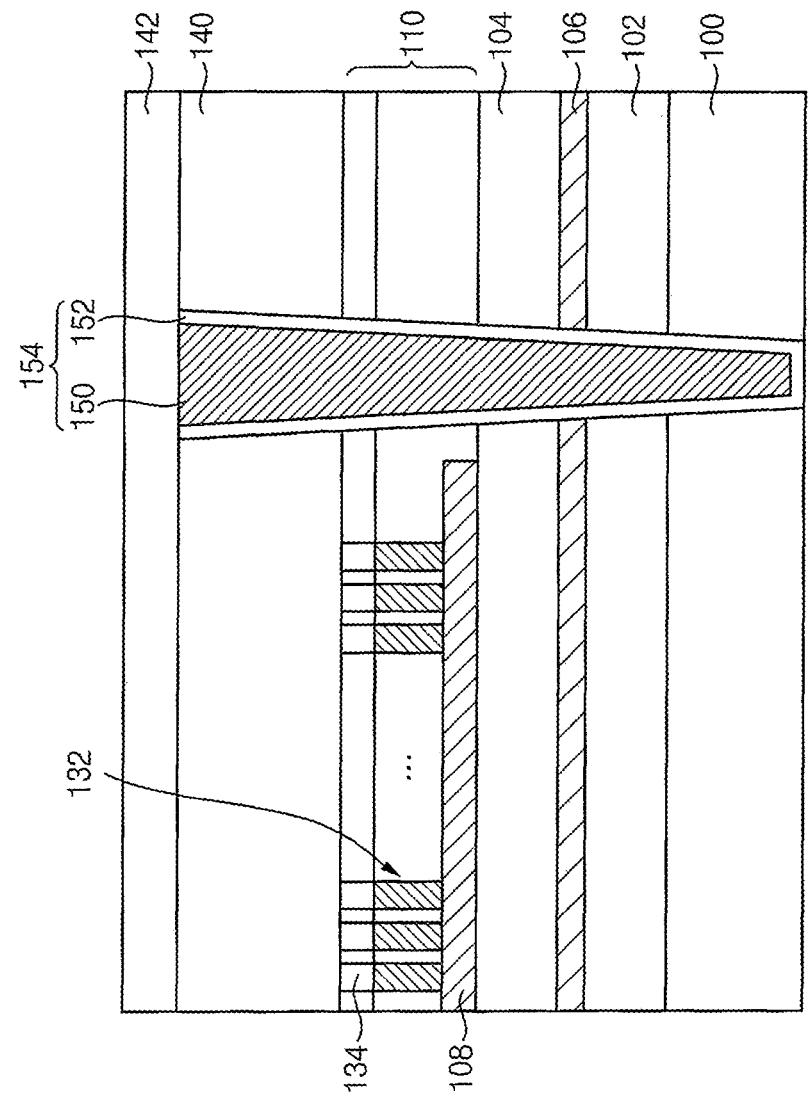

Referring to FIG. 23, a back surface of the substrate 100 may be grinded so that a thickness of the substrate 100 may be reduced. In example embodiments, when the magnetic field shielding structure 154 extends below an upper surface of the substrate 100, the back surface of the substrate 100 may be ground until a portion of the magnetic field shielding structure 154 is exposed.

According to the above process, the magnetic field shielding structure may be disposed adjacent to the cell block region in which the MRAM cells are formed, and thus the external magnetic fields may be effectively shielded, e.g., blocked from reaching the MRAM cells. Therefore, in the embedded electrical device, failures of the MRAM cells due to the external magnetic fields may be decreased.

By way of summation and review, when magnetic fields are applied from outside, a magnetic moment of a free layer of an MTJ module may be affected, thereby undesirably changing the magnetization direction of the free layer. Thus, data stored in each cell of the vertical STT-MRAM may be changed, so that an operation failure of the vertical STT-MRAM may occur. Therefore, in the vertical STT-MRAM, shielding of the external magnetic fields may be required.

Therefore, example embodiments provide an embedded device including shielded magnetic tunnel junction (MTJ) modules. That is, the embedded device may include a magnetic field shielding structure, so that external magnetic fields may be shielded, e.g., blocked, by the magnetic field shielding structure. Thus, electrical failures of the MRAM cell due to the external magnetic fields may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An embedded device, comprising:
a substrate including a magnetic random access memory (MRAM) region, the MRAM region having a cell block region;
magnetic tunnel junction (MTJ) modules in the cell block region, each of the MTJ modules including a MTJ pattern;
an insulating interlayer structure covering the MTJ modules; and
a plurality of magnetic field shielding structures in the insulating interlayer structure and adjacent to an outside of the cell block region,
wherein
each of the magnetic field shielding structures extends in a vertical direction from an upper end of the MTJ pattern to a lower end of the MTJ pattern,
each of the magnetic field shielding structures includes a ferromagnetic material, and
each of the magnetic field shielding structures has a sidewall inclined at an oblique angle with respect to the substrate.

2. The embedded device as claimed in claim 1, wherein the ferromagnetic material of the magnetic field shielding structures includes at least one material selected from the group consisting of nickel, iron, cobalt, and an alloy thereof.

3. The embedded device as claimed in claim 1, wherein each of the magnetic field shielding structures includes a ferromagnetic pattern and a seed layer pattern surrounding a surface of the ferromagnetic pattern.

4. The embedded device as claimed in claim 3, wherein the seed layer pattern includes aluminum oxide.

5. The embedded device as claimed in claim 1, wherein the magnetic field shielding structures have a pillar shape with a sidewall slope in a cross-sectional view, an upper diameter of the pillar shape and a lower diameter of the pillar shape being different from each other.

6. The embedded device as claimed in claim 1, wherein an upper portion of each of the magnetic field shielding structures has a first inner width, the first inner width gradually decreasing from the upper portion to a lower portion of each of the magnetic field shielding structures.

7. The embedded device as claimed in claim 1, wherein an upper portion of the each of the magnetic field shielding structures has a first inner width, the first inner width gradually increasing from the upper portion to a lower portion of each of the magnetic field shielding structures.

8. The embedded device as claimed in claim 1, wherein:
an inner width of the magnetic field shielding structures gradually decreases from an upper portion of each of the magnetic field shielding structures to a middle portion of each of the magnetic field shielding structures, and
the inner width gradually increases from the middle portion of each of the magnetic field shielding structures to a lower portion of each of the magnetic field shielding structures.

9. The embedded device as claimed in claim 1, wherein the magnetic field shielding structures are spaced apart from each other in a ring shape, the ring shape surrounding an outside of the cell block region.

10. The embedded device as claimed in claim 1, wherein each of the magnetic field shielding structures is in a trench, the trench surrounding an outside of the cell block region.

11. The embedded device as claimed in claim 1, wherein the magnetic field shielding structures extend vertically from an upper portion of the insulating interlayer structure through the insulating interlayer structure and the substrate.

12. The embedded device as claimed in claim 1, wherein the magnetic field shielding structures extend vertically from an upper portion of the insulating interlayer structure to a surface of the substrate.

13. The embedded device as claimed in claim 1, wherein the magnetic field shielding structures extend vertically from an upper portion of the insulating interlayer structure to an inner portion of the insulating interlayer structure.

14. An embedded device, comprising:
a substrate including a magnetic random access memory (MRAM) region, the MRAM region having a cell block region;
a lower insulation structure on the substrate;
a first conductive pattern on the lower insulation structure in the cell block region;
magnetic tunnel junction (MTJ) modules on the first conductive pattern, each of the MTJ modules including a MTJ pattern;
a second conductive pattern on each of the MTJ modules;
an insulating interlayer structure on the first conductive pattern, the insulating interlayer structure covering the first conductive pattern, the MTJ modules, and the second conductive pattern; and
a plurality of magnetic field shielding structures in the insulating interlayer structure and adjacent to an outside of the cell block region, each of the magnetic field shielding structures:
extending in a vertical direction from an upper end of the MTJ pattern to a lower end of the MTJ pattern,
including a ferromagnetic material, and
has a pillar shape with a sidewall slope in a cross-sectional view, an upper diameter of the pillar shape and a lower diameter of the pillar shape being different from each other.

15. The embedded device as claimed in claim 14, wherein the ferromagnetic material of the magnetic field shielding structures includes at least one material selected from the group consisting of nickel, iron, cobalt, and an alloy thereof.

16. The embedded device as claimed in claim 14, wherein the magnetic field shielding structures are arranged into a ring shape surrounding an outside of the cell block region.

17. The embedded device as claimed in claim 14, wherein an upper portion of each of the magnetic field shielding structures has a first inner width, the first inner width gradually decreasing or increasing from the upper portion to a lower portion of each of the magnetic field shielding structures.

18. The embedded device as claimed in claim 14, wherein the magnetic field shielding structures extend vertically from an upper portion of the insulating interlayer structure to the substrate.

19. An embedded device, comprising:
a substrate including a magnetic random access memory (MRAM) region, the MRAM region having a cell block region;
magnetic tunnel junction (MTJ) modules in the cell block region, each of the MTJ modules including a MTJ pattern;
an insulating interlayer structure covering the MTJ modules; and a plurality of magnetic field shielding structures spaced apart from each other into a ring shape in the insulating interlayer structure and surrounding an outside of the cell block region, wherein each of the magnetic field shielding structures has a pillar shape, each of the magnetic field shielding structures extends in a vertical direction from an upper end of the MTJ pattern to a lower end of the MTJ pattern, and each of the magnetic field shielding structures has a sidewall inclined at an oblique angle with respect to the substrate.

20. The embedded device as claimed in claim 19, wherein an upper portion of each of the magnetic field shielding structures has a first inner width, the first inner width gradually decreasing or increasing from the upper portion to a lower portion of each of the magnetic field shielding structures.

* * * * *